US010269173B2

(12) United States Patent
Ide (10) Patent No.: US 10,269,173 B2
(45) Date of Patent: Apr. 23, 2019

(54) LAYER DATA CREATION DEVICE AND METHOD, AND DESIGN SIMULATION DEVICE (71) Applicant: HONDA MOTOR CO., LTD., Tokyo (JP)

(72) Inventor: Daisuke Ide, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 530 days.

(21) Appl. No.: 14/902,151

(22) PCT Filed: Aug. 5, 2014

(86) PCT No.: PCT/JP2014/070646
§ 371 (c)(1),
(2) Date: Dec. 30, 2015

(87) PCT Pub. No.: WO2015/029721
PCT Pub. Date: Mar. 5, 2015

(65) Prior Publication Data
US 2016/0371880 A1 Dec. 22, 2016

(30) Foreign Application Priority Data

Aug. 30, 2013 (JP) ................. 2013-180658

(51) Int. Cl.
G06F 17/50 (2006.01)
G06T 15/50 (2011.01)
(52) U.S. Cl.
CPC ........ G06T 15/506 (2013.01); G06F 17/5009 (2013.01); G06F 17/5095 (2013.01)
(58) Field of Classification Search
CPC ............. G06F 17/5009; G06F 17/5095; G06T 15/506

(Continued)

(56) References Cited

U.S. PATENT DOCUMENTS

2006/0092412 A1* 5/2006 Doshoda ................. G01J 3/504
356/243.1
2006/0136532 A1* 6/2006 Tsuboi .................. G06T 15/506
708/200
2007/0018996 A1* 1/2007 Wang ...................... G06T 15/50
345/592

FOREIGN PATENT DOCUMENTS

JP 2004-152000 A 5/2004
JP 2005-071326 A 3/2005
WO WO 2013/035428 A1 3/2013

OTHER PUBLICATIONS

International Search Report dated Nov. 4, 2014 corresponding to International Patent Application No. PCT/JP2014/070646 and English translation thereof.

(Continued)

Primary Examiner — Andre Pierre Louis
(74) Attorney, Agent, or Firm — Squire Patton Boggs (US) LLP (57) ABSTRACT There is provided a method and a device, each of which can improve the reproducibility of the appearance of an actual product. A design layer data creation device 100 includes: a measuring instrument 151 which measures a BRDF of a design layer 210 configured by a paint color layer 202 and a clear coat layer 201; and a calculation element 120 which creates design layer data on the basis of an approximate BRDF according to a BRDF model. The calculation element 120 defines the approximate BRDF by respectively obtaining coupling coefficients Ks1, Ks2, and Kd of a specular reflectance distribution function and a diffuse reflectance distribution function so as to approximate measured BRDF data.

6 Claims, 7 Drawing Sheets (58) Field of Classification Search
USPC .............................................................. 703/1
See application file for complete search history.

(56) References Cited

OTHER PUBLICATIONS

Kazuya Kiyoi et al., "Measurement of Granularity of Metallic Materials," Journal of the Color Science Association of Japan, Mar. 1, 2006, vol. 30, No. 1, pp. 9-15 (cited on p. 2 of the specification, English abstract included in reference).

* cited by examiner

LAYER DATA CREATION DEVICE AND METHOD, AND DESIGN SIMULATION DEVICE

TECHNICAL FIELD

The present invention relates to a design layer data creation device and a method, and a design simulation device.

BACKGROUND ART

In recent years, in the development of the design of a product, such as an automobile body, a technique that displays an appearance of a virtual product on a display by using computer graphics (CG) has been used. In order to make the appearance of a virtual product close to the appearance of an actual product, the accurate definitions of reflection characteristics (bidirectional reflectance distribution function (BRDF)) of real paint are important as data for reproducing the appearance of the virtual product.

In order to accurately define a BRDF of a real paint, as hardware and algorithm for quantitatively evaluating the graininess of a metallic color used in a paint of a product, there is proposed a technique in which graininess is represented by three physical quantities of the brightness of high brightness portion, the area of light brightness portion, and the number of high brightness portions, and in which the graininess having a visual correlation is quantified by a multiple linear regression formula using these parameters as explanatory variables (Non-Patent Literature 1).

CITATION LIST

Non Patent Literature

Non-Patent Literature 1: Kazuya Kiyoi, et al., "Measurement of Granularity of Metallic Materials", Journal of the Color Science Association of Japan, Mar. 1, 2006, Vol. 30, No. 1, pp. 9-15

SUMMARY OF INVENTION

Technical Problem

However, in the measurement of a BRDF of an actual paint, which is performed by using a current measuring instrument, it is difficult to measure the BRDF with sufficient accuracy in a regular reflection region (region observed at an angle equal to the incident angle), a substantially horizontal region (region in which the observation direction is substantially parallel to the painted surface), and the like.

As a result, there is a problem that the appearance of the virtual product created by using the measured BRDF does not reproduce the appearance of the actual product, and hence, the appearance of the virtual product needs to be tuned by an expert, or a prototype needs to be created.

The present invention has been made in view of the problem. An object of the present invention is to provide a method and device, each of which can improve the reproducibility of the appearance of an actual product.

Solution to Problem

A design layer data creation device of the present invention includes: a measuring instrument which measures reflectance distribution of a design layer configured by a paint color layer having color and formed on the surface of an object, and a transparent clear coat layer superimposed on the paint color layer to cover the paint color layer; and a calculation element which defines a reflectance distribution function according to a reflectance distribution model so as to approximate the measurement result of the reflectance distribution of the design layer, and which creates design layer data that show a property of the design layer on the basis of the reflectance distribution function. Further, the design layer data creation device is configured such that the reflectance distribution model is a model which defines a reflectance distribution function representing the reflectance distribution of the design layer by using, as variables, an incident direction vector and a reflection direction vector of light at one point of the design layer, such that the reflectance distribution function is defined by a linear combination of: a specular reflectance distribution function that represents specular reflectance distribution for defining a specular reflection mode by using, as variables, the incident direction vector and the reflection direction vector of light at the one point of the design layer, and by changing at least one of brightness, hue and saturation of color at the one point of the design layer according to the reflection direction vector; and a diffuse reflectance distribution function that represents diffuse reflectance distribution for defining a diffuse reflection mode in which the incident direction vector and the reflection direction vector of light at one point of the design layer are used as variables, and in which, irrespective of the reflection direction vector, and at the one point of the design layer, brightness, hue and saturation of color are constant, or the change rate of any of brightness, hue and saturation of color is smaller than the change rate of any of brightness, hue and saturation of the specular reflection mode, and such that the calculation element defines a reflectance distribution function of the design layer by obtaining a coupling coefficient of each of the specular reflectance distribution function and the diffuse reflectance distribution function so as to approximate the measurement result of the reflectance distribution of the design layer.

In the design layer data creation device of the present invention, the reflectance distribution function is defined by obtaining the coupling coefficient of the reflectance distribution function in the reflectance distribution model so as to approximate the measurement result of the reflectance distribution of the design layer configured by the clear coat layer and the paint color layer. That is, as this reflectance distribution function, among the reflectance distribution functions adaptable to the reflectance distribution model, a reflectance distribution function, which approximates the measurement result of the reflectance distribution of the design layer, is defined.

In general, a range, in which a measurement error of the measuring instrument is caused, is limited to narrow ranges, such as a range in the vicinity of the regular reflection angle or in the vicinity of the horizontal direction end. For this reason, among the measurement results of the reflectance distribution of the design layer, portions having high adaptability to the reflectance distribution model (portions in which the influence of the measurement error of the measuring instrument is small) are reflected in the reflectance distribution function, so that the specular reflectance distribution function and the diffuse reflectance distribution function, which reflect the actual reflection mode, are used as components of the reflectance distribution function. On the other hand, portions having low adaptability to the reflectance distribution model (portions in which the influence of the measurement error of the measuring instrument is large) is hardly reflected in the reflectance distribution function.

In this case, since the influence of the measurement error of the measuring instrument is reduced, it is possible to create design layer data which are appropriate from the viewpoint of improving the reproducibility of the appearance of an actual product, and which accurately represent the reflectance distribution (BRDF) of the actual design layer by using the reflectance distribution function.

In the design layer data creation device of the present invention, it is preferred that the reflectance distribution function be a function which is configured by using, as variables, the incident direction vector and the reflection direction vector of light at one point of the design layer, and by linearly combining: a regular reflectance distribution function that represents regular reflectance distribution defining a regular reflection mode in the clear coat layer; the specular reflectance distribution function; and the diffuse reflectance distribution function, and which is configured such that the calculation element obtains the coupling coefficient of the regular reflectance distribution function on the basis of a physical property of the material of the clear coat layer.

In the design layer data creation device having the above configuration, the clear coat layer directly receives light, and hence, it is not necessary to consider the influence of other layer on the clear coat layer. For this reason, the coupling coefficient of the regular reflectance distribution function of the clear coat layer is determined on the basis of the physical property (surface reflectance or refractive index) of the material of the clear coat layer, and hence, it is considered that the regular reflectance distribution function and the coupling coefficient of the regular reflectance distribution function indirectly represent the regular reflection mode of the clear coat layer. As a result, the reflectance distribution function representing the reflectance distribution (BRDF) of the design layer is more accurately defined.

In the design layer data creation device of the present invention, it is preferred that the specular reflectance distribution function be configured by at least two functions of a first specular reflectance distribution function, and a second specular reflectance distribution function representing second specular reflectance distribution, and that, as the coupling coefficient of the specular reflectance distribution function, the calculation element obtain a coupling coefficient of the first specular reflectance distribution function, and a coupling coefficient of the second specular reflectance distribution function.

In the design layer data creation device configured as described above, the reflectance distribution function representing the reflectance distribution of the design layer is defined by two or more of the reflectance distribution functions, and hence, the color flop phenomenon and the Flip-flop phenomenon are accurately reproduced from the difference between two or more of the reflectance distribution modes. As a result, the reflectance distribution function (approximate BRDF) representing the reflectance distribution (BRDF) of the design layer is more accurately defined.

In the design layer data creation device of the present invention, it is preferred that the calculation element be configured such that, from the measurement result data of the reflectance distribution of the design layer, the measurement result data being measured by the measuring instrument, the coupling coefficient is obtained so as to minimize the error of each of the approximated specular reflectance distribution function and the approximated diffuse reflectance distribution function by using the range of the reflection in the regular direction.

It should be noted that, in the design layer data creation device configured as described above, "regular direction" means the direction of reflected light which does not include transmission and refraction with respect to an incident angle of predetermined incident light (for example, the direction of reflected light having a reflection angle in the range of −75 degrees to 75 degrees when the incident light is incident at 45 degrees).

In the design layer data creation device configured as described above, the reflected light in the direction (other than the regular reflection), in which the measurement error of the measuring instrument is increased, is excluded, and hence, the reflectance distribution function representing the reflectance distribution (BRDF) of the design layer is more accurately defined.

In the design layer data creation device configured as described above, a range, in which the measurement error is hardly caused, is extracted from the measurement result of the reflectance distribution of the design layer. For this reason, a coupling coefficient of each of the specular reflectance distribution function and the diffuse reflectance distribution function is defined so as to approximate the extracted data. Thereby, it is possible to surely reduce the influence of the measurement error while appropriately reflecting the measurement result of the reflectance distribution of the design layer. As a result, the reflectance distribution function representing the reflectance distribution (BRDF) of the design layer is more accurately defined.

A design simulation device of the present invention is a device which simulates a design of a design layer configured by a paint color layer having color and formed on the surface of an object, and a transparent clear coat layer superimposed on the paint color layer to cover the paint color layer, the device including: the design layer data creation device of the present invention, which outputs design layer data representing a property of the design layer; a design layer data storage section which stores the design layer data outputted by the design layer data creation device; a product data storage section which stores product data including shape data of a product; and an output unit which outputs a calculation result of the calculation element, and being configured such that the calculation element creates image data of the product colored with paint on the basis of the design layer data stored in the design layer data storage section, and on the basis of the product data stored in the product data storage section.

In the design simulation device of the present invention, the appearance of a virtual product is created by using design layer data created by the design layer data creation device of the present invention.

As a result, the appearance of a product under development can be confirmed without requiring the tuning of the appearance of a virtual product by an expert, and the creation of prototype, and the like, and hence, the design development process can be simplified and shortened.

A design layer data creation method of the present invention includes: a measuring process in which reflectance distribution of a design layer, configured by a paint color layer having color and formed on the surface of an object, and a transparent clear coat layer superimposed on the paint color layer to cover the paint color layer, is measured as measurement result data of the reflectance distribution of the design layer; a definition process in which a specular reflectance distribution function is configured such that specular reflectance distribution for defining a specular reflection mode is represented by using, as variables, an incident direction vector and a reflection direction vector of light at one point of the design layer, and by changing at least one of brightness, hue and saturation of color at the one point of the design layer according to the reflection direction vector, in which a diffuse reflectance distribution function represents a diffuse reflectance distribution that defines a diffuse reflection mode configured such that the incident direction vector and the reflection direction vector of light at one point of the design layer are used as variables, and such that, irrespective of the reflection direction vector, and at one point of the design layer, brightness, hue and saturation of color are constant, or the change rate of any of brightness, hue and saturation of color is smaller than the change rate of any of brightness, hue and saturation of the specular reflection mode, in which a coupling coefficients of each of the specular reflectance distribution function and the diffuse reflectance distribution function is obtained so as to approximate the measurement result of the reflectance distribution of the design layer, and in which reflectance distribution of the design layer is defined by linearly combining the specular reflectance distribution and the diffuse reflectance distribution function by using each of the coupling coefficients; and a data creation process which creates design layer data representing a property of the design layer on the basis of the definition of the reflectance distribution.

DESCRIPTION OF EMBODIMENTS

Figure 1:
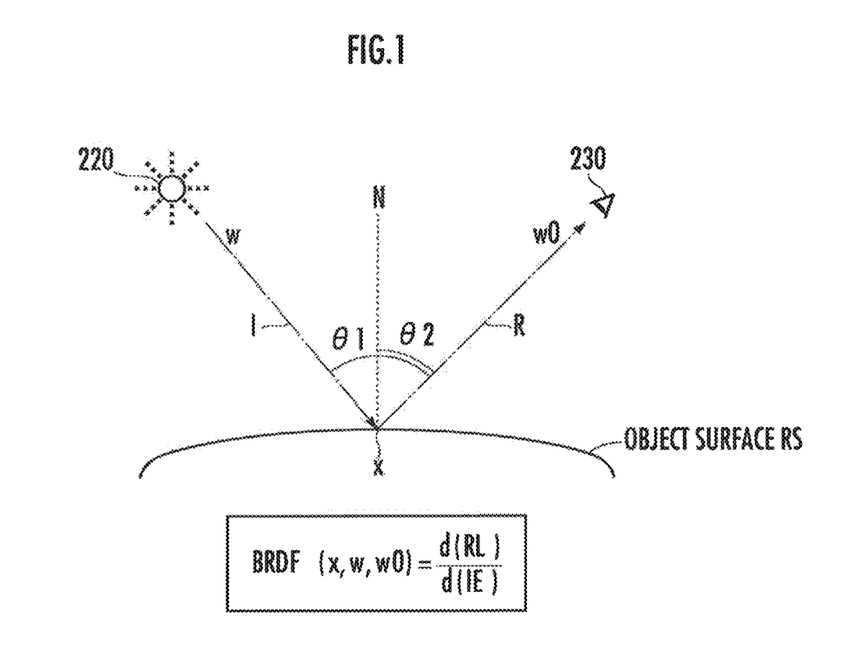
FIG. 1 is a conceptual illustration of a BRDF.

In the design development of an object (for example, a vehicle), a BRDF (bidirectional reflectance distribution function), used when the appearance of the object is created by a simulation, and the like, is, as shown in FIG. 1, a function representing the distribution of the ratio of radiance RL of reflected light R in the direction of an observation position 230 with respect to irradiance IE of incident light I which is incident on a target point (reflection point) x from an light source 220. The ratio is changed according to the target point x (position x), and is changed according to an irradiation light vector w (dashed line arrow) which is a vector showing the traveling direction (irradiation direction) of the incident light I traveling from the light source 220 to the target point x, and according to a reflected light vector w0 (two-dot chain line arrow) which is a vector showing the traveling direction (observation direction) of the reflected light R traveling from the target point x to the observation position 230.

It should be noted that each of the irradiation light vector w and the reflected light vector w0 is a three-dimensional vector, and the irradiation light vector w and the reflected light vector w0 do not necessarily exist in the same plane. However, here, for simplicity of explanation, as shown in FIG. 1, description is made on the assumption that the irradiation light vector w and the reflected light vector w0 exist on the same plane.

Further, in the following, as shown in FIG. 1, an incident angle $\theta 1$ is an angle between the irradiation light vector w and the normal direction N of the reflecting surface (object surface) RS at the target point x, and an reflection angle $\theta 2$ is an angle between the normal direction N of the reflecting surface RS at the target point x and the reflected light vector w0. It should be noted that, in the present embodiment, since the irradiation light vector w and the reflected light vector w0 exist on the same plane, the incident angle $\theta 1$ and reflection angle $\theta 2$ are represented in one dimension, but the representation of the angles is not limited to the one dimension. One of or both the incident angle $\theta 1$ and the reflection angle $\theta 2$ may be represented by two-dimensional components (an elevation component and an azimuthal component).

First, before the calculation method of BRDF in the present embodiment is described, a design layer 210 assumed in the present embodiment, and the mode of the reflected light R at the target point x of the design layer 210 will be described with reference to FIG. 2A to FIG. 2D, and FIG. 3A to a FIG. 3C.

As shown in FIG. 2A to FIG. 2D, the design layer 210 assumed in the present embodiment is configured by a colored paint color layer 202 formed on the surface of the object, and a transparent clear coat layer 201 superimposed on the paint color layer 202 so as to cover the paint color layer 202. The paint color layer 202 may also be formed on a base layer formed on the outer side of the object.

The clear coat layer 201 is formed of a coating material which forms a transparent film having specific industrial properties, such as protective effect, and decorative effect.

The paint color layer 202 is mainly formed of one of a pearl-color pearl brilliant material, a metallic-color metallic brilliant material, and a solid-color coloring pigment, or is formed by mixing or laminating these.

The pearl-color pearl brilliant material is a brilliant material that produces, at the same time, a flip-flop phenomenon (phenomenon in which brightness is changed according to the observation angle) and a color flop phenomenon (phenomenon in which hue and saturation are changed according to the observation angle).

The metallic-color metallic brilliant material is a brilliant material that produces only the flip-flop phenomenon.

The solid-color coloring pigment is a coloring pigment that hardly causes the flop phenomenon (brightness, hue and saturation are not changed according to the observation angle).

Figure 2A:
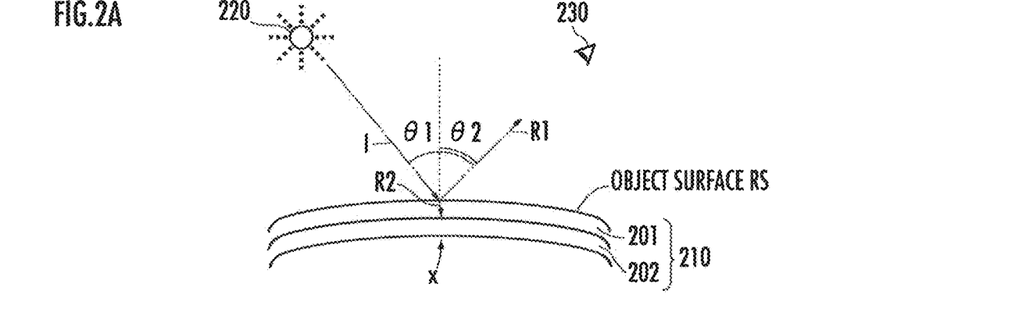
FIG. 2A is an illustration showing characteristics of regular reflection, specular reflection and diffuse reflection, and showing regular reflection on a clear coat layer.
Figure 2B:
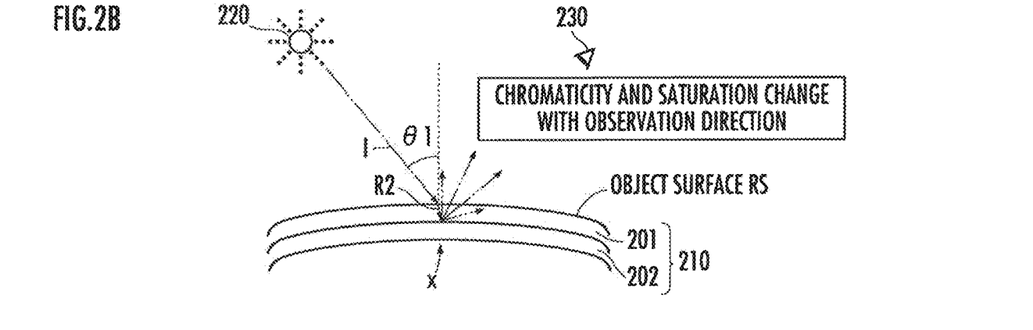
FIG. 2B is an illustration showing characteristics of regular reflection, specular reflection and diffuse reflection, and showing specular reflection of color flop in a paint color layer.
Figure 2C:
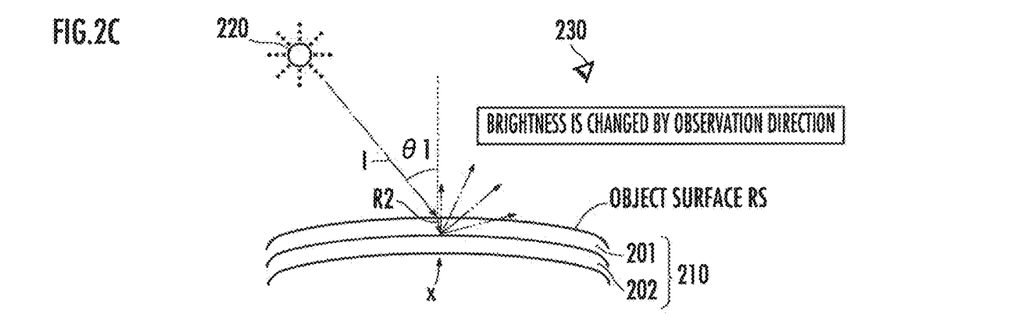
FIG. 2C is an illustration showing characteristics of regular reflection, specular reflection and diffuse reflection, and showing specular reflection of flip-flop in the paint color layer.
Figure 2D:
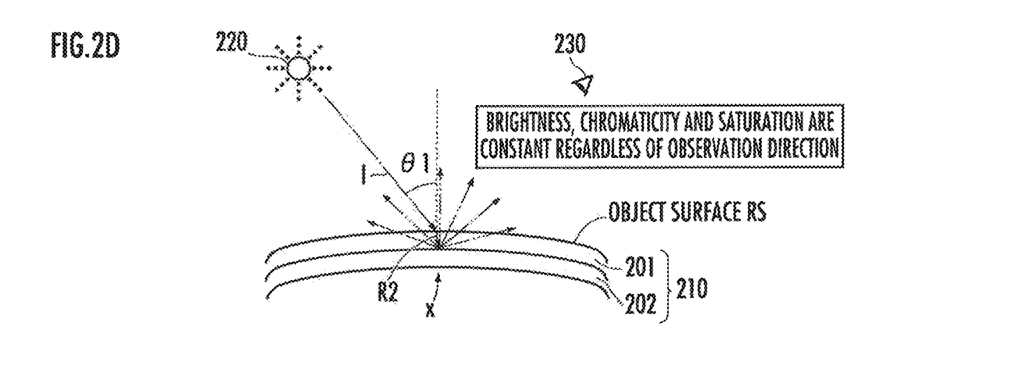
FIG. 2D is an illustration showing characteristics of regular reflection, specular reflection and diffuse reflection, and showing diffuse reflection in the paint color layer.

As shown in FIG. 2A, the incident light I emitted from the light source 220 is incident on the target point x on the clear coat layer 201 at an incident angle θ1 (for example θ1=θ0). At this time, the refractive index of the clear coat layer 201 is generally different from the refractive index outside the clear coat layer (refractive index of air). For this reason, some components (first components) R1 of the incident light I are reflected at a regular reflection angle (reflection angle θ2=θ0) in the direction of the observation position 230. On the other hand, the other components (second components) R2 are refracted and transmitted through the clear coat layer 201 to reach the paint color layer 202.

Figure 3A:
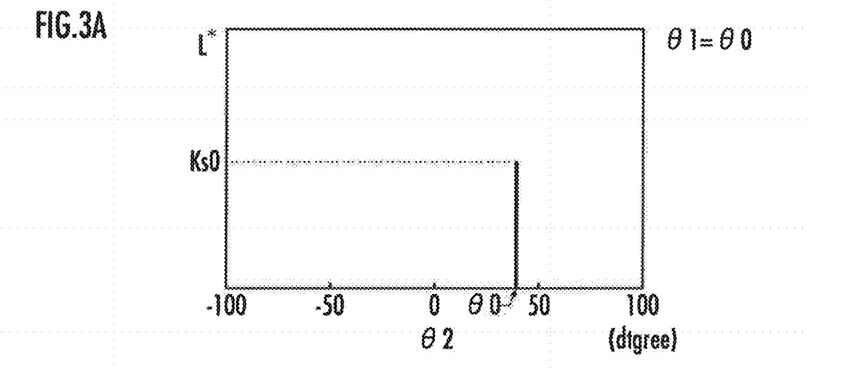
FIG. 3A is an illustration showing BRDFs of regular reflection, specular reflection, and diffuse reflection, and showing the BRDF of the regular reflection.
Figure 3B:
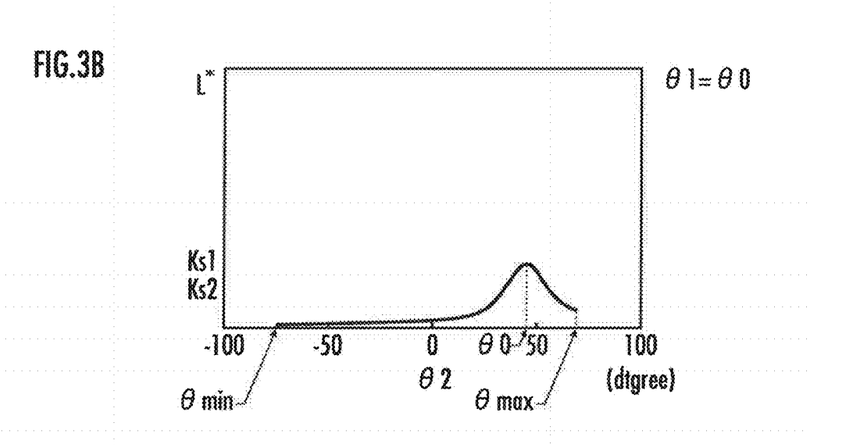
FIG. 3B is an illustration showing BRDFs of regular reflection, specular reflection, and diffuse reflection, and showing the BRDF of the specular reflection of the flip-flop and the color flop.
Figure 3C:
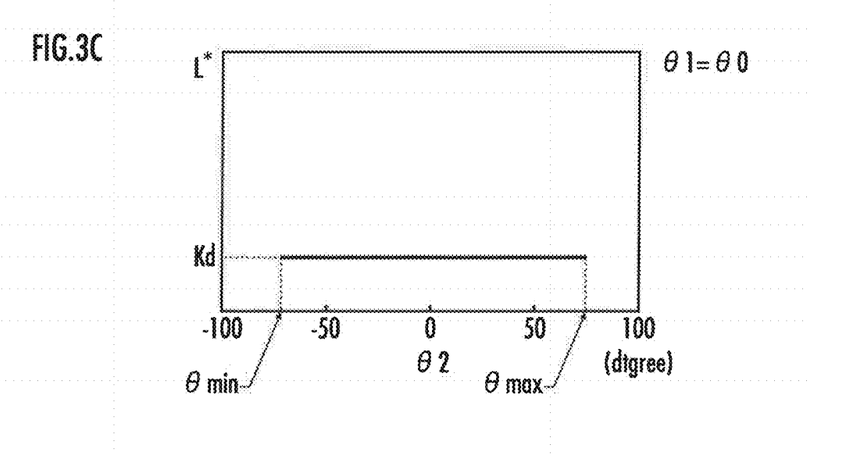
FIG. 3C is an illustration showing BRDFs of regular reflection, specular reflection, and diffuse reflection, and showing the BRDF of the diffuse reflection.

In FIG. 3A to FIG. 3C, the theoretical reflectance distribution (BRDF) for each reflection angle θ2, at the time of the incident angle θ1=θ0 of light incident on the pearl brilliant material, is shown by the brightness L* in the L*a*b* color system.

As shown in FIG. 3A, the brightness L* of the clear coat layer 201 takes a value Ks0 (Ks0>zero) at the regular reflection angle (reflection angle θ2=θ0 at the case of the incident angle θ1=θ0) and is zero at angles other than the regular reflection angle.

It is considered that the second components of the incident light I transmitted through the clear coat layer 201 are irregularly reflected by the paint color layer 202 having a complex configuration with multiple layers of paint and coating. As described above, in the paint color layer 202, mainly, a pearl-color pearl brilliant material which causes the color flop phenomenon and the flip-flop phenomenon, a metallic-color metallic brilliant material which causes the flip-flop phenomenon, and a solid-color coloring pigment which hardly causes a flop phenomenon are mixed and used.

Therefore, it is presumed that, in the paint color layer 202, one of the specular reflection of the color flop (see FIG. 2B), the specular reflection of the flip-flop (see FIG. 2C), and the diffuse reflection with almost no occurrence of flop phenomenon (see FIG. 2D) is caused.

First, the specular reflection of the flip-flop will be described with reference to FIG. 3B. Since, when the incident light is incident on the paint color layer 202, the incident light is reflects in various directions by the effect of the brilliant material, the brightness L* (value of BRDF) of specular reflection components is, as shown in FIG. 3B, comprehensively shown by a graph which has a peak in the regular reflection direction and which is spread in the reflection angle direction. As shown in FIG. 3B, the brightness L* (value of BRDF) in the specular reflection component has a peak value Ks1 or Ks2 at the regular reflection angle θ2, and has a positive value in the predetermined range in the vicinity of the regular reflection angle θ2 and is zero other than the predetermined range.

It should be noted that, although not shown in the graph, when the color flop phenomenon is caused, the chromaticities a* and b* are changed. When the color flop phenomenon is caused, and when the reflection is shown by the RGB color system, each of R value, G value, and B value has a different peak and a different distribution.

As shown in FIG. 3C, the brightness L* (value of BRDF) in the diffuse reflection components takes a value Kd which is almost fixed in the all range in the reflection angle direction. It should be noted that the brightness L* (value of BRDF) of diffuse reflection components is not necessarily fixed in the all range in the reflection angle direction, but the absolute value of the change rate of the brightness L* (value of BRDF) of diffuse reflection components is generally smaller than the absolute value of the change rate of the brightness L* (value of BRDF) of the specular reflection components in the range in which the brightness L* (value of BRDF) of specular reflection components is not zero.

Further, since the paint color layer 202 exists underneath the clear coat layer 201, the incidence directions and the reflecting directions in each of the specular reflection and the diffuse reflection are strictly different from the irradiation light vector w and the reflected light vector w0 at the target point x. However, since the thickness of the design layer 210 is in a negligible range, it can be considered that the reflection by the paint color layer 202 is identical with the reflection at the target point x.

Figure 4A:
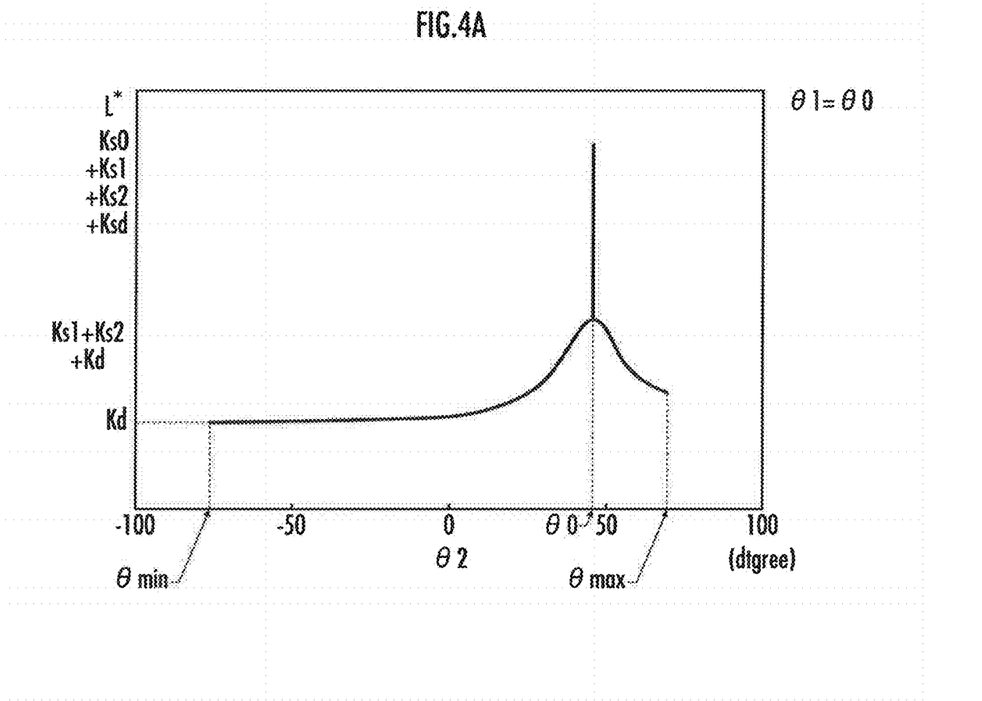
FIG. 4A is an illustration showing a BRDF model and a measured BRDF, and showing a graph of the BRDF model.

Further, when the design layer 210 is configured by the clear coat layer 201 and the paint color layer 202, it is presumed that the brightness L* of the design layer 210 as a whole is ideally represented by the graph of FIG. 4A which is given by a linear combination of the brightness L* (see FIG. 3A) in the clear coat layer 201 and the brightness L* (see FIG. 3B and FIG. 3C) in the paint color layer 202.

It should be noted that the actual BRDF (hereinafter referred to as "real BRDF") in the design layer 210 is presumed to be represented by a graph similar to a BRDF model (hereinafter referred to as "BRDF model") representing the ideal BRDF in the design layer 210 (representing, in FIG. 4A, the distribution of the brightness L* which can be identical with the BRDF (distribution of reflectance) when the irradiance IE of the incident light I is constant).

That is, when the incident angle θ1 is the predetermined angle θ0, as shown in FIG. 4A (the horizontal axis: the angle of reflection angle θ2, and the vertical axis: B brightness L*), the BRDF model has a substantially constant value in the range in which the reflection angle θ2 is not less than θ min and less than 0 degree. Further, in the range in which the reflection angle θ2 is not less than 0 degree and less than the regular reflection angle (θ2=θ0), the BRDF model almost monotonically increases. When the reflection angle θ2 is equal to the regular reflection angle (θ2=θ0), the BRDF model at the one point has a value larger than the values at other points. In the range in which the reflection angle θ2 is not less than the regular reflection angle (θ2=θ0) and less than θ max, the BRDF model almost monotonically decreases.

This graph is expressed by the following formula 1.

$$BRDF(x,w,w0)=Ks0*Fresnel(x,w,w0)+Ks1*Cook\text{-}Torrance(x,w,w0,m1)+Ks2*Cook\text{-}Torrance(x,w,w0,m2)+Kd*Diffuse(x) \quad \text{(Formula 1)}$$

The characters contained in the formula are as follows:
x: position of target point;
w: incident direction vector;
w0: reflection direction vector;
Ks0: regular reflection coupling coefficient (peak intensity of the regular reflection component (first component) of the reflected light in the clear coat layer);

Ks1: first specular reflection coupling coefficient (peak intensity of the first specular reflection component of the reflected light);

Ks2: second specular reflection coupling coefficient (peak intensity of the second specular reflection component of the reflected light);

Kd: diffuse reflection coupling coefficient (peak intensity of the diffuse reflection component of the reflected light);

m1: coefficient of the spread of the distribution of the reflectance at the first specular reflection;

m2: coefficient of the spread of the distribution of the reflectance at the second specular reflection;

Fresnel: regular reflection distribution function (function representing the distribution of Fresnel reflectance), Cook-Torrance: specular reflectance distribution function (function representing the distribution of reflectance of specular reflection components in mirror surface highlight model (Cook-Torrance model));

Diffuse: diffuse reflectance distribution function (function representing the distribution of diffuse reflectance in diffuse reflection model (Oren-Nayar model)).

It should be noted that BRDF, the regular reflection distribution function Fresnel, the reflectance distribution function Cook-Torrance of specular reflection components, the diffuse reflectance distribution function Diffuse, coupling coefficients Ks0, Ks1, Ks2 and Kd, and the distribution spread coefficients m1 and m2, each of these has a different value for each of RGB components of light, and hence, calculation using formula 1 is performed for each of RGB components of light. It should be noted that the calculation using formula 1 may be collectively performed for all the RGB components of light by adding the wavelength components as parameters to the values.

Since the reflectance distribution function Cook-Torrance of specular reflection components is used, Ks1 and Ks2 are coefficients representing the peak values of reflectance distributions, and m1 and m2 are coefficients representing the spreads of the distribution functions.

The two reflectance distribution functions Cook-Torrance represent the flip-flop phenomenon and the color flop phenomenon. For example, in the areas of specular reflection, when Ks1 (or Ks2) is high, a flip-flop phenomenon is represented in which the intensity of the reflected light is increased to the maximum Ks1 in the vicinity of the regular reflection angle, and on the other hand, as the reflection angle is away from the regular reflection angle, the intensity of reflected light of diffuse reflection components is reduced. Further, when the distribution spread coefficient m1 (or m2) is large, the range (range in which the flip-flop phenomenon is caused), in which specular reflection components are more strongly reflected in the reflected light than the diffusion reflection components, is reduced.

Further, the color flop phenomenon is represented by Ks1, Ks2, Kd, m1 and m2. For example, when blue is strong in Ks1 (B value is large in Ks1) and is small in m1, and when red is strong in Ks2 (R value is large in Ks2) and is large in m2, formula 1 represents a BRDF of the design layer 210, which causes a color flop phenomenon (the color flop is strong) that blue is strong in the vicinity of the regular reflection angle, and red is strong as the angle of reflection angle is away from the regular reflection angle. It should be noted that, when the color of Ks1 is almost equal to the color of Ks2 (the values of RGB of Ks1 are all almost equal to the values of RGB of Ks2), or when m1 is almost equal to m2, formula 1 represents a BRDF of the design layer 210, in which the color flop phenomenon is hardly caused (the color flop is weak).

Figure 4B:
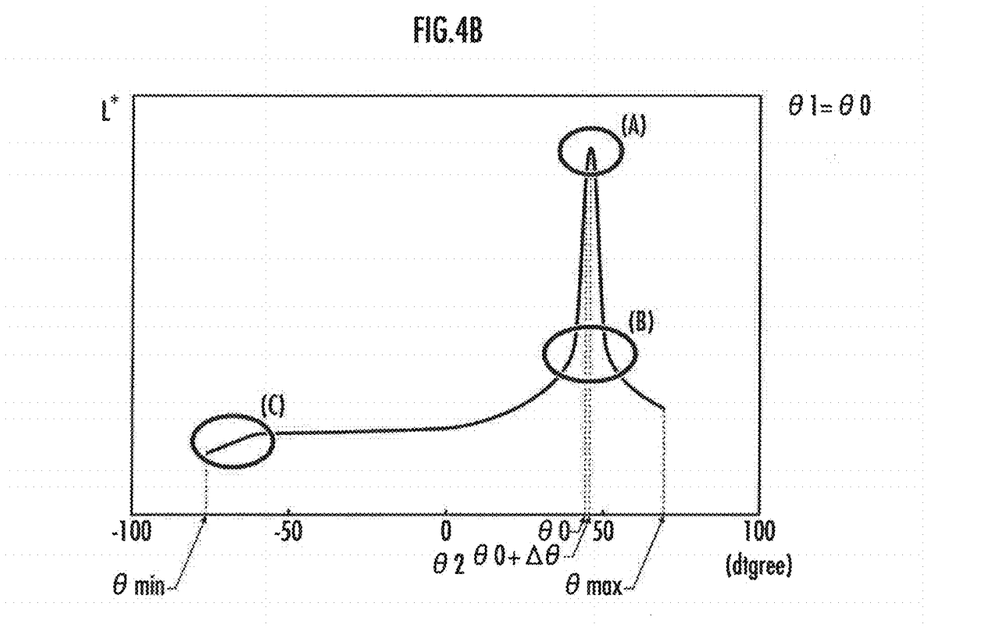
FIG. 4B is an illustration showing the BRDF model and the measured BRDF, and showing a graph of the measured BRDF.

The graph of the brightness L* of the design layer 210 as shown in FIG. 4B, (in the following, the brightness L* is referred to as "measured BRDF", since the BRDF (distribution of reflectance) is identified with the distribution of brightness L* when the irradiance IE of the incident light I is constant) in which brightness L* is measured by the actual measuring instrument at the incident angle of 45 degrees with respect to a pearl brilliant material, is different from the graph of the BRDF model shown in FIG. 4A.

That is, as shown in FIG. 4B (horizontal axis: angle of reflection angle θ2, vertical axis: brightness L*), the values of the measured BRDF are almost similar to the values of the BRDF model. However, the measured BRDF may be different from the BRDF model in that the angle at which the value of the measured BRDF is a peak value is shifted from the angle at which the value of the BRDF model serves is a peak value (A), in that the value of the measured BRDF in the vicinity of the regular reflection angle is larger than the value of the BRDF model (B), and in that the value of the measured BRDF in the horizontal direction (at about −80 degrees) is smaller than the value of the BRDF model (C).

It is inferred that the difference between the BRDF model and the measured BRDF is due to measurement error. For this reason, when the BRDF (hereinafter referred to as "approximate BRDF"), which approximates the measured BRDF, is obtained from formula 1 on the basis of the data of the measured BRDF (when Ks0, Ks1, Ks2, Kd, m1 and m2 are obtained), portions of the measured BRDF, which have high adaptability to portions of the BRDF model (portions having small influence of the measurement error of the measuring instrument), are reflected in the approximate BRDF, and on the other hand, portions of the measured BRDF, which have low adaptability to portions of the BRDF model (portions having large influence of the measurement error of the measuring instrument, see FIGS. 4A(A), (B) and (C)), are hardly reflected in the approximate BRDF, as a result of which the influence of the measurement error can be reduced.

Although not illustrated in the figures, the brightness L* of each of the reflection angles measured by the measuring instrument at the incident angle of 45 degrees with respect to a metallic brilliant material has the tendency (specular reflection) similar to the brightness L* of the pearl brilliant material. Regarding the brightness L* of each of the reflection angles at the incident angle of 45 degrees with respect to a red solid color, there is almost no reflection due to the specular reflection components.

Further, the reproducibility of the appearance of an actual object including color can be enhanced by performing a design simulation using the approximate BRDF.

It should be noted that, when there are a plurality of light sources, the above-described calculation may be performed for each of the light sources.

In the following, the present embodiment will be described on the basis of the above description.

(Configuration of Design Simulation Device 100)

Figure 5:
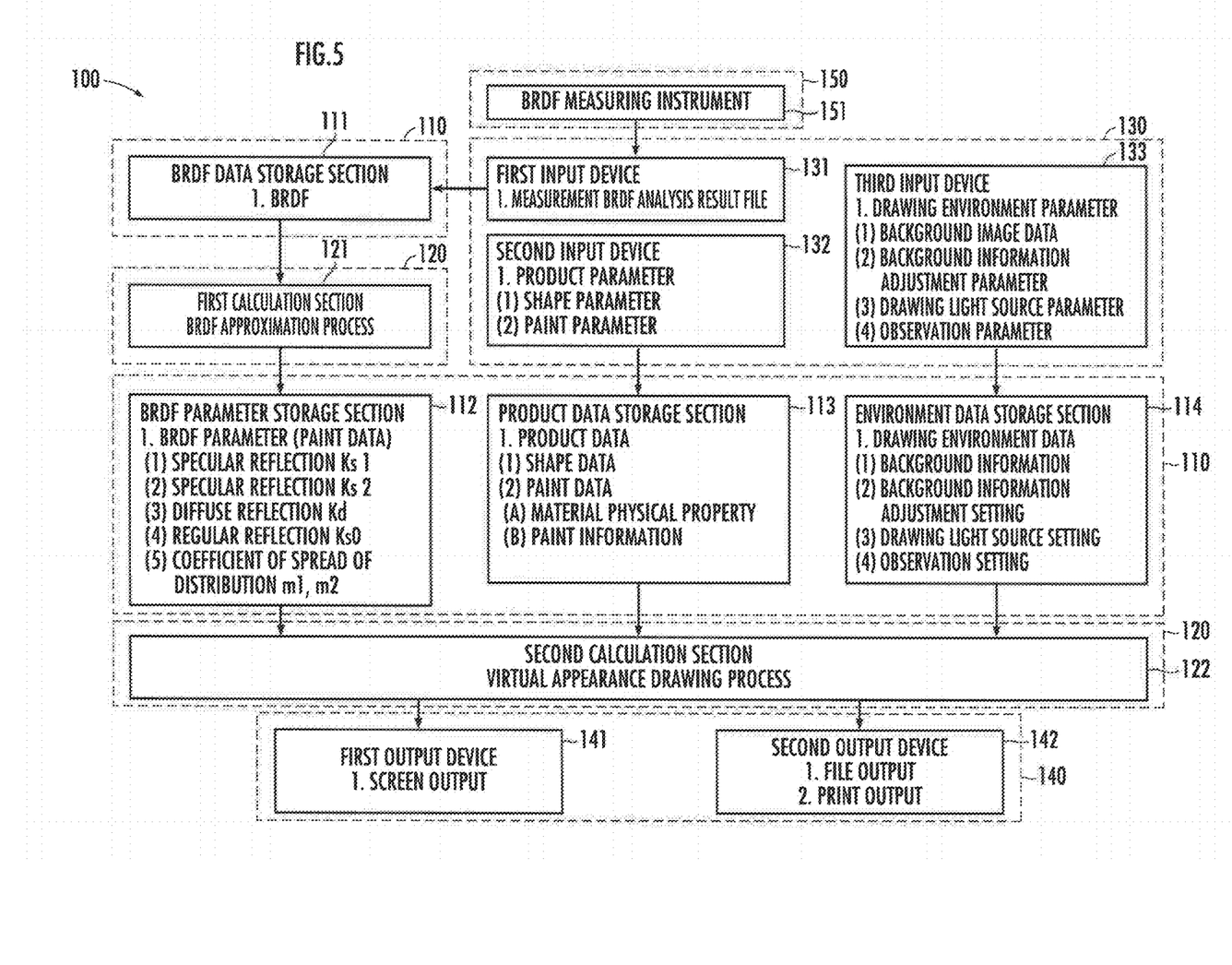
FIG. 5 is a view showing a configuration of a design simulation device of a present embodiment.

The design simulation device 100 as the present embodiment shown in FIG. 5 is a device which, in a paint design stage of design development of an object (such as a vehicle), displays a virtual appearance of the object by simulation in order to confirm whether or not the displayed design matching the intention of the designer is realized. It should be noted that "design" in the present embodiment means appearance properties made of the shape of an object, and optical properties, such as color, of the clear coat layer 201 and the paint color layer 202 which are formed on the surface of the object.

The design simulation device 100 is configured by a computer, and includes a storage unit 110, a calculation element 120, an input unit 130, an output unit 140, and a measurement unit 150.

The storage unit 110 is configured by a memory or a file server, or the like, and includes a BRDF data storage section 111, a BRDF parameter storage section (design layer data storage section) 112, a product data storage section 113, and an environment data storage section 114.

The calculation element 120 is configured by a CPU (central processing unit) and a GPU (image data processing integrated circuit) which are components of the computer, and includes a first calculation section 121 and a second calculation section 122.

The input unit 130 is configured by a mouse pointing device and a keyboard which are used for performing information input operations, and a port which receives information from an external connection device, such as a measuring instrument, and includes a first input device 131, a second input device 132, and a third input device 133.

The output unit 140 includes a first output device 141 and a second output device 142 which are configured by a display device, and the like, configured to output and display an image, numerical data, and the like, that show the design of the objective, and also to output and display an image, and the like, that shows an operation interface.

The measurement unit 150 includes a BRDF measuring instrument 151.

The BRDF data storage section 111 is configured to store BRDF data (hereinafter referred to as "measured BRDF data") showing changes of colors measured by the BRDF measuring instrument 151 for all of incident angles and reflection angles of each of a plurality of kinds of paint. Other than the measured BRDF data, the BRDF data storage section 111 may store data, such as data of minute optical behavior of flakes contained in a paint, and large pattern data of crimps, and the like.

The BRDF parameter storage section 112 is configured to store, as parameters for obtaining an approximate BRDF, a regular reflection coupling coefficient Ks0, a first specular reflection coupling coefficient Ks1, a second specular reflection coupling coefficient Ks2, and a diffuse reflection coupling coefficient Kd for each of paintings.

The regular reflection coupling coefficient Ks0 is a coupling coefficient which represents the intensity of a regular reflection component (first component) on the clear coat layer with respect to a reflected light. Each of the first specular reflection coupling coefficient Ks1 and the second specular reflection coupling coefficient Ks2 is a coupling coefficient which represents the intensity of a specular reflection component with respect to reflected light. The diffuse reflection coupling coefficient Kd is a coupling coefficient which represents the intensity of a diffuse reflection component with respect to reflected light.

It should be noted that, in the diffuse reflection coupling coefficient Kd, spectral properties corresponding to transmissivity and reflectance of a material are reflected, which properties are exhibited while incident light incident on the material from a light source is repeatedly absorbed, reflected, and transmitted by the material.

It should be noted that each of the regular reflection coupling coefficient Ks0, the first specular reflection coupling coefficient Ks1, the second specular reflection coupling coefficient Ks2, and the diffuse reflection coupling coefficient Kd has a different value for each of RGB components of light. Further, RGB components of each of the regular reflection coupling coefficient Ks0, the first specular reflection coupling coefficient Ks1, the second specular reflection coupling coefficient Ks2, and the diffuse reflection coupling coefficient Kd are not less than zero.

Again, in FIG. 5, as virtual product data of a product under development, the product data storage section 113 is configured to store shape data (for example, CAD data) about the shape of an object about the product, and material physical properties (surface reflectance and refractive index) and paint data such as paint information (of currently used paints) of each of the clear coat layer 201 and the paint color layer 202 (see FIG. 2) which configure the design layer 210.

The environment data storage section 114 is configured to store drawing environmental information data for observing the design of the object, for example, positions and angles of the light source and the observation. "Drawing environment data" is configured by "background information", "background information adjustment setting (corresponding to optical information, such as reflected rate, reflected image brightness, reflected image γ value (master, RGB), when the clear coat layer 201 is fixed)", "drawing light source setting (corresponding to incident angle, light source brightness, and the like)", and "observation setting".

The first calculation section 121 is configured to define a BRDF according to a BRDF model by approximating measurement results (measured BRDF data) of a BRDF of the design layer 210 by the least squares method, and configured to created design layer data representing properties of the design layer 210 on the basis of the defined BRDF. More specifically, the first calculation section 121 obtains coupling coefficients Ks1, Ks2, Kd respectively for the specular reflectance distribution function and the diffuse reflectance distribution function, by approximating measurement results (measured BRDF data) of the reflectance distribution of the design layer 210, and thereby defines a reflectance distribution function (approximate BRDF) of the design layer 210.

Further, the first calculation section 121 is configured to obtain a regular reflection coupling coefficient Ks0 for a paint of the object, on the basis of material physical properties of the clear coat layer 201 to be pained.

The second calculation section 122 is configured such that a virtual appearance of the object under development, which is to be painted with a paint, is calculate by a path integral method (Path Tracing) on the basis of parameters of the approximate BRDF which are stored in the BRDF parameter storage section 112, shape data and paint data of the object under development which are stored in the product data storage section 113, and drawing environment data stored in the environment data storage section 114. The path integral method is a method of collectively calculating the behavior of light incident on the object under the environment without distinction between direct light and indirect light.

More specifically, the color distribution of paint is calculated by the second calculation section 122 according to the observation position (the reflection angle θ2 of the object surface). When the design layer 210 is configured by the paint color layer 202 having a color and the transparent clear coat layer 201, the color distribution can be calculated corresponding to the reflection angle θ2 of the object surface by taking into consideration all of optical properties, such as refractive indexes, in each layer.

For example, first, the second calculation section 122 specifies the configuration of the design layer 210 on the basis of the paint data read from the product data storage section 113. Then, in the configuration of the specified design layer 210, for each of the positions x on the surface of the object, the second calculation section 122 calculates the color at each of the points of the surface of the object by obtaining the reflectance at the position x for each of the RGB components on the basis of the parameters of the approximate BRDF which are stored in the BRDF parameter storage section 112, the shape data of the object under development which are stored in the product data storage section 113, and the drawing environment data stored in the environment data storage section 114. By calculating the color at the position x for the entire surface of the object, the second calculation section 122 creates a virtual appearance of the object in the environment specified by the drawing environment data stored in the environment data storage section 114.

It should be noted that the color of the surface of the object is calculated as a result of combination of original base color of the object and reflected color. The base color is a color visually recognized when light irradiated from the light source is diffusely reflected in the paint layer, and is calculated on the basis of the BRDF of the design layer 210. The reflected color is a color visually recognized when light irradiated from the light source is reflected in a specular manner on the surface of the object, and is calculated on the basis of the regular reflectance of the clear coat layer 201.

Through the second input device 132, the color distribution of the paint may be changed by changing at least one of the shape of the product, the material physical property of the paint (surface reflectance or refractive index), the paint information, and the like.

For example, when the designer specifies new shape parameters through the second input device 132 (for example, may specify shape parameters by inputting new CAD data) to change the shape data of the product, the second calculation section 122 reads the changed shape data from the product data storage section 113, and also reads, from the BRDF parameter storage section 112, the BRDF parameters corresponding to the irradiation light vector w and the reflected light vector w0 which match the changed parameters, and then calculates the color distribution of the object corresponded to the changed shape. Corresponding to the changed color distribution of the object, the appearance of the virtual object is created and outputted to the first output device 141. Thereby, the designer can confirm the appearance of the virtual object conforming to the changed shape.

Through the third input device 133, the color distribution of the paint may be changed by changing at least one of the irradiation direction of light and the observation direction.

Further, the parameters, such as the material physical properties, about the design layer 210 are virtually specified by the second input device 132. These parameters are data for determining the configuration of the design layer 210. According to the interface displayed in the first output device 141, corresponding factors are specified by inputting numerical values, and the like, into an input column, or selecting a choice in a pull-down menu through the second input device 132.

The calculation element 120 is configured to perform processing required to advance the design development, such as processing for calculating parameters about the design, and processing for calculating data to be provided to the designer, in addition to processing of the first calculation section 121 and the second calculation section 122.

That the calculation element 120 (the first calculation section 121 and the second calculation section 122) "is configured" to perform a calculation means that the calculation element 120 "is programmed" so as to read data and software required by the CPU and GPU, from a predetermined storage device, such as a memory, and then performs arithmetic processing on the data according to the software, to externally output or store the results of the arithmetic processing.

The first input device 131 is configured such that the data file of the measured BRDF data-analysis result for calculation of the BRDF parameters, and the like, can be inputted from a device, such as the BRDF measuring instrument 151, into the design simulation device 100.

The second input device 132 is configured such that "product parameters" for configuring "product data" serving as the basis for the calculation by the calculation element 120 can be inputted by the designer. The "product parameters" include the shape parameters of the object, and the paint parameters including the kind of color, the coating method, and the like.

The third input device 133 is configured such that "drawing environmental parameters" for configuring the "drawing environment data" can be inputted by the designer. The "drawing environmental parameters" include "background image data", "background information adjustment parameters", "drawing light source parameters", and "observation parameters".

The first output device 141 is configured to display the calculation results (the virtual appearance of the object, and the like) provided by the calculation elements 120.

The second output device 142 is configured to output, to another file, the calculation results provided by the calculation elements 120, or to print-output the calculation results.

The BRDF measuring instrument 151 is configured to measure a BRDF of the design layer 210 to be measured for each of RGB components, and is configured to input the measurement results (measured BRDF data) into the design simulation device 100 via the first input device 131. As the measurement method of the BRDF (deflection angle spectral reflectance), it is possible to use a known method, such as a method described in Japanese Patent Laid-Open No. 2013-58175. It should be noted that the BRDF is preferably measured for the reflection angle in the regular direction ($\theta$ min to $\theta$ max) in order to reduce the measurement error of the BRDF measuring instrument 151.

(Function of Design Simulation Device 100)

The design simulation device 100 is configured such that the BRDF approximation processing (see FIG. 6) and the virtual appearance drawing processing are performed by the calculation element 120.

In this configuration, the virtual appearance drawing processing is processing in which, by using the approximate BRDF obtained by the BRDF approximation processing, and on the basis of the product data and the paint data stored in the product data storage section 113, and on the basis of the drawing environment data stored in the environment data storage section 114, and by using the path integral method (Path Tracing), light beams incident on the object under the environment are obtained irrespective of the direct light and the indirect light, and a virtual appearance of the object is created on the basis of the light beams.

In the following, the BRDF approximation processing will be described with reference to the flow chart shown in FIG. 6.

(BRDF Approximation Processing)

The BRDF approximation processing is processing to obtain an approximate BRDF (BRDF parameters for most closely approximating the measured BRDF) on the basis of the measured BRDF data and the configuration of the design layer 210.

Figure 6:
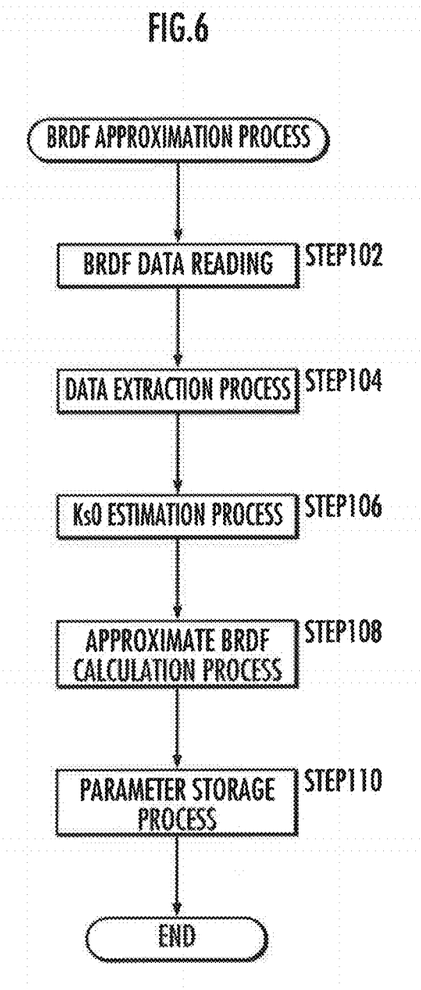
FIG. 6 is a flow chart showing a BRDF approximation process.

The calculation element 120 reads, from the BRDF data storage section, measured BRDF data of the target design layer 210, the data being measured by the BRDF measuring instrument 151 (FIG. 6/STEP 102).

The calculation element 120 extracts data, to be used as the processing, by removing, from the read measured BRDF data, data in the vicinity of the peak value of the measured BRDF (for example, in a predetermined range in the vicinity of the regular reflection angle determined by an experiment, or the like, from the viewpoint of reducing the measurement error of the BRDF measuring instrument 151), and data in the vicinity of the bottom color (for example, in a horizontal direction range determined by the experiment, or the like, from the viewpoint of reducing the measurement error of the BRDF measuring instrument 151) (FIG. 6/STEP 104). It is presumed that, due to the measurement error of the BRDF measuring instrument 151, the data of the measured BRDF are inaccurate in the vicinity of the peak value thereof and the bottom color value. For this reason, it is possible to improve the accuracy of the approximation BRDF by removing the inaccurate data in the vicinity of the peak value and the bottom color. It should be noted that the range, in which the parameters are removed, may be set in such a manner that a range, in which the reproducibility of appearance of the object is enhanced, is obtained by experiments about typical paints.

The calculation element 120 estimates the regular reflection coupling coefficient Ks0 from the surface reflectance and refractive index of each of material physical properties of the clear coat layer 201 (FIG. 6/STEP 106).

The calculation element 120 obtains the approximate BRDF so as to approximate the measured BRDF data (FIG. 6/STEP 108). More specifically, for the BRDF shown by formula 1, a set of Ks1, Ks2, Kd, m1 and m2 of the BRDF, which most closely approximate the measured BRDF data with a part thereof removed, is obtained by an approximation method, such as the least squares method. It should be noted that the first term on the right side of formula 1 only represents the peak value of the regular reflection in the clear coat layer 201, and hence, as shown in the formula 2, an approximate BRDF may be obtained, which, only by the second to fourth terms on the right side of formula 1, approximates the measured BRDF data with a part thereof removed.

$$BRDF(x,w,w0)=Ks1*\text{Cook-Torrance}(x,w,w0,m1)+ Ks2*\text{Cook-Torrance}(x,w,w0,m2)+Kd*\text{Diffuse}(x) \quad \text{(Formula 2)}$$

It should be noted that the first term on the right side of formula 1 represents the distribution of the ratio of radiance of the reflected light in the clear coat layer 201 with respect to the irradiance IE of the incident light I. Each of the second term and third term on the right side of formula 1 represents the distribution of the ratio of the radiance of the reflected light by specular reflection in the paint color layer 202 with respect to the irradiance IE of the incident light I, and each of the second term and third term on the right side represents a specular reflection component. The fourth term on the right side of formula 1 represents especially the distribution of the ratio of the radiance of the reflected light by diffuse reflection in the solid pigmented layer (bottom color layer) used as the bottom color of the paint color layer 202, with respect to the irradiance IE of the incident light I.

It should be noted that each of BRDF, Fresnel reflection coefficient: Fresnel, reflectance of specular reflection component: Cook-Torrance, diffuse reflectance: Diffuse, regular reflection coupling coefficient: Ks0, first specular reflection coupling coefficient Ks1, second specular reflection coupling coefficient Ks2, diffuse reflection coupling coefficient Kd, have different values for each of RGB components of light, and hence are calculated for each of the RGB components of the light in formula 1.

On the basis of Ks0, Ks1, Ks2, Kd, m1 and m2 which are obtained in STEP 106 and STEP 108, the calculation element 120 calculates a BRDF of the design layer 210, which represents the reflectance for each of RGB and for all incident angles and reflection angles. Then, as the design layer data representing the design layer 210, the calculation element 120 stores the calculated BRDF in the BRDF parameter storage section 112 (FIG. 6/STEP 110), and terminates the BRDF approximation processing.

(Effect of Present Embodiment)

In the present embodiment, in the design layer 210 configured by the clear coat layer 201 and the paint color layer 202, the reflectance distribution function (approximate BRDF) is defined by obtaining coupling coefficients Ks0, Ks1, Ks2 and Kd of the reflectance distribution function (BRDF, formula 1) in the reflectance distribution model (BRDF model), so as to approximate the measurement results of the reflectance distribution of the design layer 210 (measured BRDF data). That is, among the reflectance distribution functions (BRDF, formula 1) adapted to the reflectance distribution model (BRDF model), the reflectance distribution function (approximate BRDF) is defined so as to approximate the measurement results of the reflectance distribution of the design layer 210 (measured BRDF data).

In general, a range, in which the measurement error of the BRDF measuring instrument 151 is caused, is limited in very narrow ranges in the vicinity of the regular reflection angle, or in the vicinity of the horizontal direction end. For this reason, the specular reflectance distribution function (for example, Cook-Torrance) and the diffuse reflectance distribution function (for example, Diffuse), which reflect the actual reflection mode, are used as the components of the reflectance distribution function BRDF. Thereby, the portions of the measurement results of the reflectance distribution of the design layer 210 (measured BRDF data), which have high adaptability to the reflectance distribution model (BRDF model), are reflected in the reflectance distribution function (approximate BRDF). On the other hand, the portions (for example, (A), (B), and (C) of FIG. 4B), which have low adaptability to the reflectance distribution model (BRDF model), are hardly reflected in the reflectance distribution function (approximate BRDF).

As a result, the influence of the measurement error of the BRDF measuring instrument 151 is reduced, and hence, from the viewpoint of reproducibility of the actual object, the reflectance distribution (real BRDF) of the actual design layer 210 is accurately represented by the reflectance distribution function (approximate BRDF).

Further, in the present embodiment, the regular reflectance distribution function (for example, Fresnel) indirectly representing the regular reflection mode of the clear coat layer 201, and the coupling coefficient Ks0 of the regular reflectance distribution function are considered, and thereby, the reflectance distribution function (approximate BRDF), which represents the reflectance distribution (real BRDF) of the design layer 210, is more accurately defined.

Further, in the present embodiment, the reflectance distribution function (approximate BRDF), which represents the reflectance distribution (real BRDF) of the design layer 210, is defined by two reflectance distribution functions, and hence, the color flop phenomenon and the flip-flop phenomenon are accurately reproduced by use of the difference in the mode of reflectance distribution between the two or more reflectance distribution functions. As a result, the reflectance distribution function (approximate BRDF) representing the reflectance distribution (real BRDF) of the design layer is more accurately defined.

In the present embodiment, the reflected light in the direction (the direction other than the regular direction), in which the measurement error of the BRDF measuring instrument 151 is increased, is removed, and hence, the reflectance distribution function representing the reflectance distribution (BRDF) of the design layer is more accurately defined.

Further, in the present embodiment, from the measurement results (measured BRDF data) of the reflectance distribution of the design layer 210 with respect to the reflected light in the regular direction, a range (range in which the portion in the vicinity of the regular reflection and the portion in the vicinity of the horizontal direction end are removed), which is hardly influenced by the measurement errors, is extracted. For this reason, coupling coefficients Ks1, Ks2, and Kd of respective the specular reflectance distribution functions (for example, Cook-Torrance) and the diffuse reflectance distribution function (for example, Diffuse) are defined so as to approximate the extracted data, and hence, it is possible to surely reduce the influence of the measurement errors while properly reflecting the measurement results (measured BRDF data) of the reflectance distribution of the design layer 210. As a result, the reflectance distribution function (approximate BRDF) representing the reflectance distribution (real BRDF) of the design layer 210 is more accurately defined.

The appearance of the virtual object is created by using the reflectance distribution function (approximate BRDF), and thereby, the appearance of the actual object is reproduced.

As a result, in the present embodiment, the appearance of the object under development can be confirmed without requiring the tuning of the appearance of the virtual product by an expert, and the creation of a prototype, and the like, and hence, the design development process can be simplified and shortened.

Figure 7A:
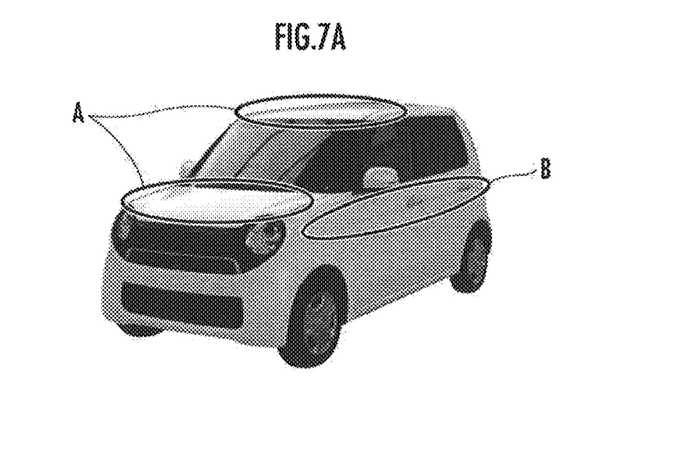
FIG. 7A is a view showing an appearance of an actual object.
Figure 7B:
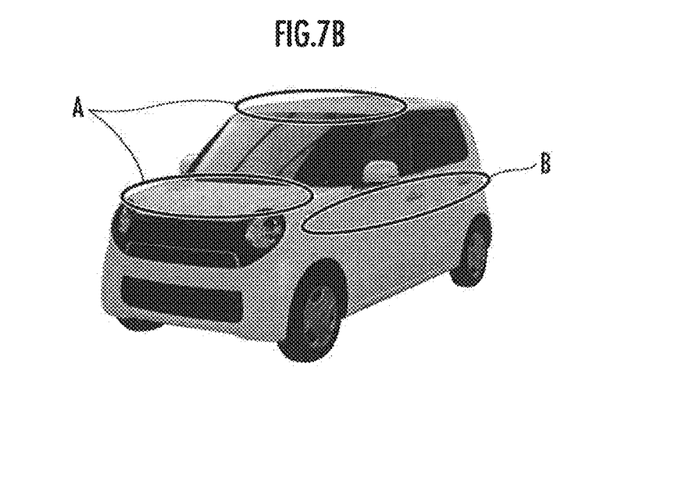
FIG. 7B is a view showing an appearance of a virtual object created by a conventional design simulation device.

More specifically, from the appearance of shade (see symbols A in FIG. 7A) with respect to the characteristic lines of the actual object (see FIG. 7A), the shade being obtained by using a conventional design simulation device using a CG which was generated by using the measured BRDF data as they were, it was seen that appropriate shade could not be represented as shown by symbols A and B in FIG. 7B. That is, when the conventional design simulation device was used, it was seen that the reflection by the clear coat was not properly reflected (A), that the specular reflection was blurred (B), and that the brightness of the bottom color was low (B). For this reason, the tuning of the appearance of the virtual product by an expert, or the creation of prototype has been required.

Figure 7C:
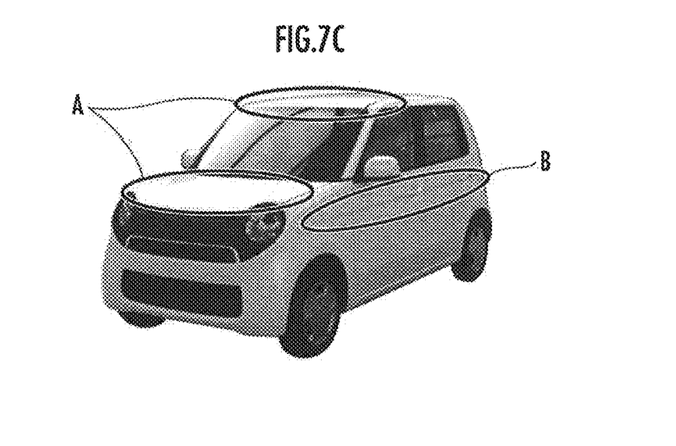
FIG. 7C is a view showing an appearance of a virtual object created by the design simulation device of the present embodiment.

When the design simulation device 100 of the present embodiment is used, the reflection, the specular reflection and the bottom color of the clear coat are appropriately reflected as shown in FIGS. 7C ((A) and (B)). Thereby, the reproducibility of the appearance of the actual object (FIG. 7A) including color is improved. Therefore, it is possible to confirm whether or not the appearance of an object of a virtual product matches the appearance intended by the designer in the design development process, without requiring the tuning of the appearance of the virtual product by an expert, and the creation of prototype.

Another Embodiment

Instead of the BRDF measuring instrument 151 being configured to measure the reflectance distribution of the design layer 210 for each of RGB components, the BRDF measuring instrument 151 may also be configured to measure the reflectance distribution of the design layer 210 for typical wavelengths, respectively. As the light source 220 in this case, a wavelength-selective LED may be used.

REFERENCE SIGNS LIST

100 . . . Design simulation device, 110 . . . Storage unit, 120 . . . Calculation element, 130 . . . Input unit, 140 . . . Output unit, 150 . . . Measurement unit, 151 . . . BRDF measuring instrument, 201 . . . Clear coat layer, 202 . . . Paint color layer, 210 . . . Design layer, 220 . . . Light source, 230 . . . Observation position, w . . . Incident direction vector (irradiation light vector), w0 . . . Reflecting direction vector (reflected light vector), $\theta 1$ . . . Incident angle, $\theta 2$ . . . Reflection angle, Ks0 . . . Regular reflection coupling coefficient, Ks1 . . . First specular reflection coupling coefficient, Ks2 . . . Second specular reflection coupling coefficient, Kd . . . Diffuse reflection coupling coefficient

The invention claimed is:

1. A design layer data creation device comprising:
a measuring instrument which measures reflectance distribution of a design layer configured by a paint color layer having color and formed on the surface of an object, and a transparent clear coat layer superimposed on the paint color layer to cover the paint color layer;
a first calculation element which defines a reflectance distribution function according to a reflectance distribution model on the basis of a measurement result of the reflectance distribution of the design layer, and creates design layer data that represents a property of the design layer on the basis of the reflectance distribution function,
wherein the reflectance distribution model is a model which defines a reflectance distribution function representing the reflectance distribution of the design layer by using, as variables, an incident direction vector and a reflection direction vector of light at one point of the design layer, and
the reflectance distribution function is defined by linear combination of: a specular reflectance distribution function that represents specular reflectance distribution for defining a specular reflection mode by using, as variables, the incident direction vector and the reflection direction vector of light at the one point of the design layer, and by changing at least one of brightness, hue and saturation of color at the one point of the design layer according to the reflection direction vector; and a diffuse reflectance distribution function that represents diffuse reflectance distribution for defining a diffuse reflection mode,
wherein the incident direction vector and the reflection direction vector of light at one point of the design layer are used as variables,
wherein irrespective of the reflection direction vector, and at one point of the design layer, brightness, hue and saturation of color are constant, or the change rate of any of brightness, hue and saturation of color is smaller than the change rate of any of brightness, hue and saturation of the specular reflection mode,
wherein the first calculation element generates an approximate reflectance distribution function which approximates the measurement result of the reflectance distribution of the design layer by obtaining a coupling coefficients of the specular reflectivity distribution function and the diffuse reflectance distribution function to define the approximate reflectance distribution function as the reflectance distribution of the design layer, and wherein the design layer data creation device further comprises a second calculation element which creates a virtual image of the object by using the reflectance distribution function, wherein creating the virtual image of the object comprises applying a paint color layer or a clear coat layer to a surface of the object, the object being one or more vehicles, and a display device which displays the virtual image.

2. The design layer data creation device according to claim 1, wherein the reflectance distribution function uses, as variables, the incidence direction vector and the reflecting direction vector of light at one point of the design layer, and is a function given by a linear combination of a regular reflectance distribution function representing regular reflectance distribution defining a regular reflection mode in the clear coat layer, the specular reflectance distribution function, and the diffuse reflectance distribution function, and the first calculation element obtains a coupling coefficient of the regular reflectance distribution function on the basis of a material physical property of the clear coat layer.

3. The design layer data creation device according to claim 1, wherein the specular reflectance distribution function is configured by at least two functions of a first specular reflectance distribution function, and a second specular reflectance distribution function representing second specular reflectance distribution, and as coupling coefficients of the specular reflectance distribution function, the first calculation element obtains a coupling coefficient of the first specular reflectance distribution function, and a coupling coefficient of the second specular reflectance distribution function.

4. The design layer data creation device according to claim 1, wherein the first calculation element obtains the coupling coefficients of an approximate specular reflectance distribution function and an approximate diffuse reflectance distribution function, wherein each error of the approximate specular reflectance distribution function and the approximate diffuse reflectance distribution function with respect to the measurement result by the measuring instrument is minimized.

5. The design layer data creation device according to claim 1, further comprising:

a design layer data storage section which stores design layer data outputted by the design layer data creation device;

a product data storage section which stores product data including shape data of a product; and an output unit which outputs a calculation result of the first calculation element, wherein the first calculation element creates image data of the product colored with paint, on the basis of the design layer data stored in the design layer data storage section, and on the basis of the product data stored in the product data storage section.

6. A design layer data creation method comprising:

a measuring process in which reflectance distribution of a design layer, configured by a paint color layer having color and formed on the surface of an object, and a transparent clear coat layer superimposed on the paint color layer to cover the paint color layer, is measured as measurement result data of the reflectance distribution of the design layer;

a definition process wherein a specular reflectance distribution of a specular reflectance distribution function for defining a specular reflection mode is represented by using, as variables, an incident direction vector and a reflection direction vector of light at one point of the design layer, and by changing at least one of brightness, hue and saturation of color at one point of the design layer according to the reflection direction vector, wherein a diffuse reflectance distribution function represents a diffuse reflectance distribution that defines a diffuse reflection mode, wherein the incident direction vector and the reflection direction vector of light at one point of the design layer are used as variables, wherein irrespective of the reflection direction vector, and at one point of the design layer, brightness, hue and saturation of color are constant, or the change rate of any of brightness, hue and saturation of color is smaller than the change rate of any of brightness, hue and saturation of the specular reflection mode, wherein an approximate reflectance distribution function which approximates the measurement result of the reflectance distribution of the design layer is generated by coupling coefficients of the specular reflectance distribution function and the diffuse reflectance distribution function to define the approximate reflectance distribution function as the reflectance distribution of the design layer, and wherein reflectance distribution of the design layer is defined by linearly combining the specular reflectance distribution and the diffuse reflectance distribution function by using each of the coupling coefficients; and a data creation process which creates design layer data representing a property of the design layer on the basis of the definition of the reflectance distribution, wherein the method further comprises creating a virtual image of the object by using the reflectance distribution function, wherein creating the virtual image of the object comprises applying a paint color layer or a clear coat layer to a surface of the object, the object being one or more vehicles, and displaying the virtual image with a display device.

* * * * *